(12) United States Patent
Zur et al.

(10) Patent No.: US 11,501,951 B1
(45) Date of Patent: Nov. 15, 2022

(54) X-RAY IMAGING IN CROSS-SECTION USING UN-CUT LAMELLA WITH BACKGROUND MATERIAL

(71) Applicant: Applied Materials Israel Ltd., Rehovot (IL)

(72) Inventors: Yehuda Zur, Tel-Aviv (IL); Alon Litman, Nes-Ziona (IL)

(73) Assignee: APPLIED MATERIALS ISRAEL LTD., Rehovot (IL)

(*) Notice: Subject to any disclaimer, the term of this patent is extended or adjusted under 35 U.S.C. 154(b) by 61 days.

(21) Appl. No.: 17/320,526

(22) Filed: May 14, 2021

(51) Int. Cl.
  *H01J 37/244* (2006.01)
  *H01J 37/22* (2006.01)
  (Continued)

(52) U.S. Cl.
  CPC ........ *H01J 37/244* (2013.01); *G01N 23/2202* (2013.01); *G01N 23/2252* (2013.01);
  (Continued)

(58) Field of Classification Search
  CPC ............... H01J 37/244; H01J 37/222; H01J 2237/2445; H01J 2237/2561;
  (Continued)

(56) References Cited

U.S. PATENT DOCUMENTS 6,670,610 B2 * 12/2003 Shemesh ............. H01J 37/3056
  850/9
7,297,965 B2 * 11/2007 Kidron ..................... G01N 1/32
  250/311

(Continued)

FOREIGN PATENT DOCUMENTS

WO    2014106200 A2    7/2014

OTHER PUBLICATIONS

U.S. Appl. No. 17/173,016, "Notice of Allowance", dated Apr. 27, 2022, 9 pages.
PCT/US2022/013327, "International Search Report and Written Opinion", dated May 10, 2022, 10 pages.
(Continued)

*Primary Examiner* — David A Vanore
(74) *Attorney, Agent, or Firm* — Kilpatrick Townsend & Stockton LLP

(57) ABSTRACT

A method of performing x-ray spectroscopy material analysis of a region of interest within a cross-section of a sample using an evaluation system that includes a focused ion beam (FIB) column, a scanning electron microscope (SEM) column, and an x-ray detector, including: forming a lamella having first and second opposing side surfaces in the sample by milling, with the FIB column, first and second trenches in the sample to expose the first and second sides surface of the lamella, respectively; depositing background material in the second trench, wherein the background material is selected such that the background material does not include any chemical elements that are expected to be within the region of interest of the sample; generating a charged particle beam with the SEM column and scanning the charged particle beam across a region of interest on the first side surface of the lamella such that the charged particle beam collides with the first side surface of the lamella at a non-vertical angle; and detecting x-rays generated while the region of interest is scanned by the charged particle beam.

20 Claims, 7 Drawing Sheets

(51) Int. Cl.
   *G01N 23/2252*   (2018.01)
   *G01N 23/2202*   (2018.01)

(52) U.S. Cl.
   CPC ...... *H01J 37/222* (2013.01); *G01N 2223/079* (2013.01); *G01N 2223/401* (2013.01); *H01J 2237/2445* (2013.01); *H01J 2237/2561* (2013.01); *H01J 2237/31749* (2013.01)

(58) Field of Classification Search
   CPC ...... H01J 2237/31749; G01N 23/2202; G01N 23/2252; G01N 2223/079; G01N 2223/401
   See application file for complete search history.

(56) References Cited

U.S. PATENT DOCUMENTS

| | | | |
|---|---|---|---|
| 7,443,953 | B1 | 10/2008 | Yun |
| 7,659,506 | B2 | 2/2010 | Avinun-Kalish et al. |
| 8,709,269 | B2 | 4/2014 | Shemesh |
| 8,723,144 | B2 * | 5/2014 | Kidron .................. H01J 37/28 250/311 |
| 9,412,560 | B2 | 8/2016 | Stone et al. |
| 9,607,233 | B2 | 3/2017 | Kaizerman et al. |
| 9,625,398 | B1 * | 4/2017 | Campbell .......... G01N 23/2252 |
| 9,702,835 | B1 | 7/2017 | Campbell et al. |
| 9,715,723 | B2 | 7/2017 | Shlain et al. |
| 9,905,394 | B1 | 2/2018 | Bhattiprolu et al. |
| 9,928,990 | B2 | 3/2018 | Campbell et al. |
| 10,043,264 | B2 | 8/2018 | Greenberg et al. |
| 10,468,230 | B2 | 11/2019 | Lavely et al. |
| 10,522,323 | B2 | 12/2019 | Tiemeijer |
| 10,535,495 | B2 * | 1/2020 | Willis ..................... H01J 37/20 |
| 10,825,648 | B2 | 11/2020 | Hendriksen et al. |
| 10,830,715 | B2 | 11/2020 | Campbell et al. |
| 10,890,545 | B2 | 1/2021 | Bender |
| 10,903,044 | B1 * | 1/2021 | Litman ............. H01L 27/11582 |
| 10,922,809 | B2 | 2/2021 | Shemesh et al. |
| 11,022,565 | B2 | 6/2021 | Shemesh et al. |
| 11,199,401 | B1 * | 12/2021 | Zur ........................ G01B 15/02 |
| 11,280,749 | B1 * | 3/2022 | Zur .......................... G01N 1/32 |
| 11,404,244 | B1 * | 8/2022 | Zur ..................... G01N 23/2252 |
| 2006/0011868 | A1 * | 1/2006 | Kidron .................... H01J 37/28 250/492.22 |
| 2008/0273662 | A1 | 11/2008 | Yun et al. |
| 2009/0078867 | A1 * | 3/2009 | Avinun-Kalish ........................... G01N 23/2202 250/492.21 |
| 2016/0093468 | A1 | 3/2016 | Lang et al. |
| 2016/0169816 | A1 | 6/2016 | Peters et al. |
| 2017/0067838 | A1 | 3/2017 | Anan et al. |
| 2018/0136147 | A1 * | 5/2018 | Randolph .......... G01N 23/2257 |
| 2019/0139735 | A1 | 5/2019 | Alvis et al. |
| 2019/0172681 | A1 * | 6/2019 | Owen ................ H01J 37/3233 |
| 2021/0033550 | A1 * | 2/2021 | Shemesh ............ G01N 23/2208 |

OTHER PUBLICATIONS

PCT/US2022/025084, "International Search Report and Written Opinion", dated Aug. 5, 2022, 12 pages.

\* cited by examiner

X-RAY IMAGING IN CROSS-SECTION USING UN-CUT LAMELLA WITH BACKGROUND MATERIAL

BACKGROUND OF THE INVENTION

In the study of electronic materials and processes for fabricating such materials into an electronic structure, a specimen of the electronic structure can be used for microscopic examination for purposes of failure analysis and device validation. For instance, a specimen of an electronic structure such as a silicon wafer can be analyzed in a scanning electron microscope (SEM) to study a specific characteristic feature in the wafer. Such a characteristic feature may include the circuit fabricated and any defects formed during the fabrication process. An electron microscope is one of the most useful pieces of equipment for analyzing the microscopic structure of semiconductor devices.

When examining a specimen with an electron beam from an SEM tool, x-rays are generated as a result of the irradiation when the electrons impact the surface of the specimen. One particular application in which an SEM tool can be used is for material analysis of a sample. For example, the SEM tool can be used for x-ray imaging material analysis by bombarding the sample with a high energy electron beam to ensure a strong signal. The high energy electron beam creates a relatively large interaction volume within the sample from which x-rays can emerge, however, resulting in relatively poor spatial resolution for the material analysis step. While a lower energy electron beam can be used in some instances, for some material analysis applications the strong signal generated from a higher energy beam is required.

Thus, improvements in x-ray imaging are desirable.

BRIEF SUMMARY OF THE INVENTION

Some embodiments of the disclosure pertain to improved methods and techniques for performing x-ray imaging in a cross-section of a sample. Embodiments can include one or more initial steps of milling the sample to form a thin lamella. The milling can be done, for example, with a focused ion beam column in a FIB-SEM (focused ion beam, scanning electron microscope) tool. After the sample is milled to create the lamella, background material can be deposited on one side of the lamella. Then, as part of a material analysis step, the sample can be bombarded with an electron beam generated by, for example a scanning electron microscope column of the FIB-SEM tool. The electron beam can be directed at the sample at an non-vertical angle (e.g., 45 degrees) on the side of the lamella opposite the side in which the background material is deposited. X-rays generated from a collision of the electron beam and sample can be collected while the sample is bombarded with electrons and the collected x-rays can be analyzed to determine the materials present within a region of the sample being evaluated. In this manner, some embodiments of the disclosure enable high-resolution material analysis to be performed on a sample using a standard FIB-SEM tool without having to remove the lamella and analyze the lamella with a separate evaluation tool.

In some embodiments, a method of performing x-ray spectroscopy material analysis of a region of interest within a cross-section of a sample using an evaluation system that includes a focused ion beam (FIB) column, a scanning electron microscope (SEM) column, and an x-ray detector is provided. The method can include: forming a lamella having first and second opposing side surfaces in the sample by milling, with the FIB column, first and second trenches in the sample to expose the first and second sides surface of the lamella, respectively; depositing background material in the second trench, wherein the background material is selected such that the background material does not include any chemical elements that are expected to be within the known materials within the region of interest of the sample; generating a charged particle beam with the SEM column and scanning the charged particle beam across a region of interest on the first side surface of the lamella such that the charged particle beam collides with the first side surface of the lamella at a non-vertical angle; and detecting x-rays generated while the region of interest is scanned by the charged particle beam.

Various implementations of the embodiments described herein can include one or more of the following features. Generating a two-dimensional image of the scanned region of interest based on the detected x-rays. The first and second side surfaces of the lamella can be substantially vertical and the charged particle beam can be scanned across a region of interest on the substantially vertical first side surface of the lamella. The background material can be deposited within the trench at a level below an area of interaction between the scanned charged particle beam and the lamella. The SEM column and FIB column can be part of a SEM-FIB evaluation tool. The charged particle beam can be directed to collide with the first surface of the lamella at a 45 degree angle to the first surface. The sample can be a semiconductor wafer.

Some embodiments pertain to a non-transitory computer-readable medium that stores instructions for performing x-ray spectroscopy surface material analysis of a region of a sample according to any of the methods above or herein. For example, by: forming a lamella having first and second opposing side surfaces in the sample by milling, with the FIB column, first and second trenches in the sample to expose the first and second sides surface of the lamella, respectively; depositing background material in the second trench, wherein the background material is selected such that the background material does not include any chemical elements that are expected to be within the known materials within the region of interest of the sample; generating a charged particle beam with the SEM column and scanning the charged particle beam across a region of interest on the first side surface of the lamella such that the charged particle beam collides with the first side surface of the lamella at a non-vertical angle; and detecting x-rays generated while the region of interest is scanned by the charged particle beam.

Some embodiments pertain to a system for performing x-ray spectroscopy surface material analysis of a region of a sample according to any of the methods set forth above or herein. For example, the system can include: a vacuum chamber; a sample support configured to hold a sample within the vacuum chamber during a sample evaluation process; a focused ion beam (FIB) column configured to direct a charged particle beam into the vacuum chamber toward the sample; a scanning electron microscope (SEM) column configured to direct a charged particle beam into the vacuum chamber toward the sample; a detector configured to detect x-rays generated from the collision between the charged particle beam and the sample; and a processor and a memory coupled to the processor. The memory can include a plurality of computer-readable instructions that, when executed by the processor, cause the system to: form a lamella having first and second opposing side surfaces in the sample by milling, with the FIB column, first and second trenches in the sample to expose the first and second sides surface of the lamella, respectively; deposit background material in the second trench, wherein the background material is selected such that the background material does not include any chemical elements that are expected to be within the region of interest of the sample; generate a charged particle beam with the SEM column and scan the charged particle beam across a region of interest on the first side surface of the lamella such that the charged particle beam collides with the first side surface of the lamella at a non-vertical angle; and detect x-rays generated while the region of interest is scanned by the charged particle beam.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Embodiments of the disclosure enable improved x-ray imaging techniques for material analysis of a sample. Some embodiments enable high-resolution material analysis to be performed on a sample using a standard FIB-SEM tool without having to remove a lamella formed on the sample and without requiring that the lamella be transferred to and analyzed with a separate evaluation tool.

Example Sample Evaluation Tool

Figure 1:
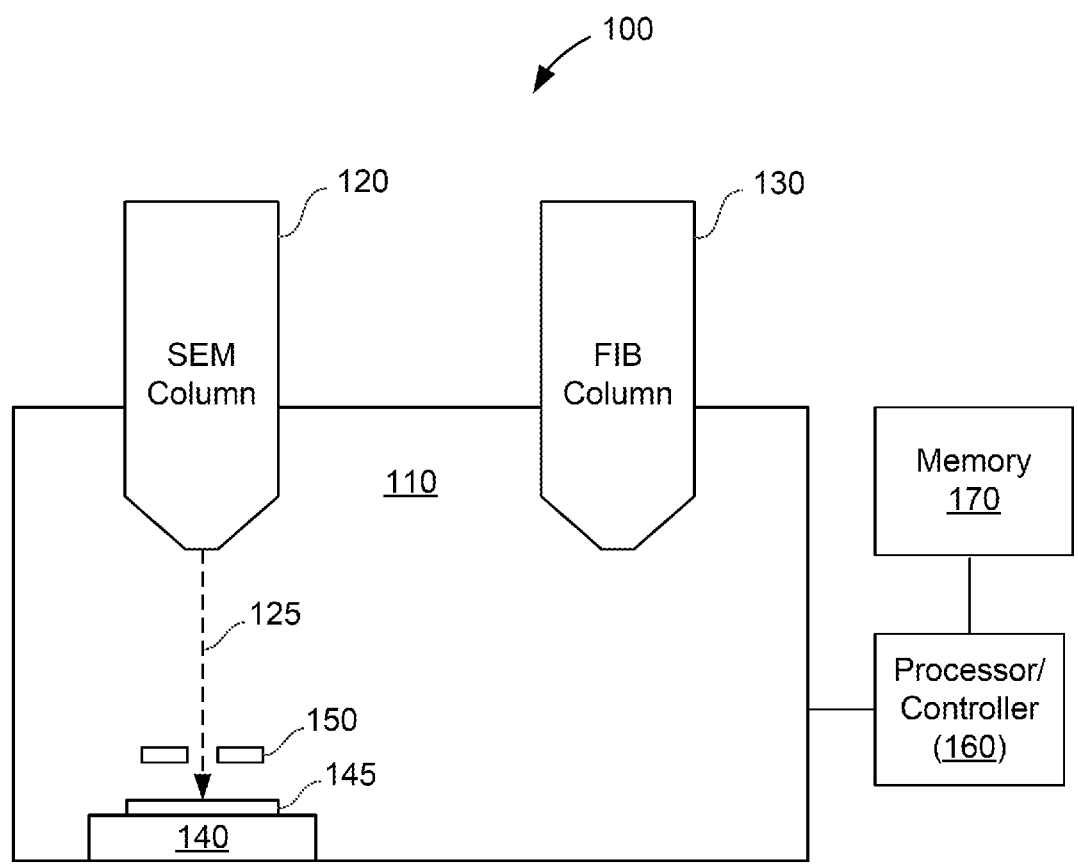
FIG. 1 is simplified illustration of a sample evaluation system according to some embodiments of the disclosure.

In order to better understand and appreciate the disclosure, reference is first made to FIG. 1, which is a simplified schematic illustration of a sample evaluation system 100 according to some embodiments of the disclosure. Sample evaluation system 100 can be used for, among other operations, defect review and analysis (including x-ray imaging) of structures formed on samples, such as semiconductor wafers.

System 100 can include a vacuum chamber 110 along with a scanning electron microscope (SEM) column 120 and a focused ion beam (FIB) column 130. A supporting element 140 (e.g., a sample support pedestal) can support a sample 145 (e.g., a semiconductor wafer) within chamber 110 during a processing operation in which the sample 145 (sometimes referred to herein as an "object" or a "specimen") is subject to a charged particle beam from one of the FIB or SEM columns. Supporting element 140 can also move the sample within vacuum chamber 110 between the field of view of the two columns 120 and 130 as required for processing.

SEM column 120 and FIB column 130 are connected to vacuum chamber 110 so that a charged particle beam generated by either one of the charged particle columns propagates through a vacuumed environment formed within vacuum chamber 110 before impinging on sample 145. SEM column 120 can generate an image of a portion of sample 145 by illuminating the sample with a charged particle beam (e.g., electron beam 125), detecting particles emitted due to the illumination and generating charged particle images based on the detected particles. Towards that end, system 100 can include a detector 150, such as an energy-dispersive x-ray spectroscopy (EDX) detector or a wavelength-dispersive x-ray spectroscopy (WDX) detector, that can be used to determine a composition of one or more microscopic structures within sample 145. The EDX detector 150 can collect x-ray photons emitted as a result of an illumination of the structures by electron beam 125, and can include an energy analyzer for determining the energy of photons that are detected by the detector, which in turn can enable system 100 to characterize the element from which an x-ray photon was emitted.

FIB column 130 can mill (e.g., drill a hole in) sample 145 by irradiating the sample with one or more charged particle beams to form a cross section and can also smooth the cross section. The cross section can include, at different locations along the cross-section, different materials that can subsequently be analyzed with SEM column 120.

The particle imaging and milling processes each typically include scanning a charged particle beam back-and-forth (e.g., in a raster scan pattern) at a constant rate across a particular area of the sample being imaged or milled. One or more lenses (not shown) coupled to each charged particle column can implement the scan pattern as is known to those of skill in the art. The area scanned is typically a very small fraction of the overall area of sample. For example, the sample can be a semiconductor wafer with a diameter of either 100 or 300 mm while each area scanned on the wafer can be a rectangular area having a width and/or length measured in microns or tens of microns.

System 100 can include one or more controllers 160, such as one or more processors or other hardware units that control the operation of system 100 by executing computer instructions stored in one or more computer-readable memories 170 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

While not shown in FIG. 1, sample evaluation system 100 can include a number of additional components including, but not limited to, one or more gas nozzles to deliver process gases to chamber 110, vacuum and other valves to control the pressure within chamber 110, and one or more lenses to direct the charged particle beam (as mentioned above) among other components.

In some embodiments, in order to evaluate a sample 145, the sample can be milled with focused ion beam generated by charged particle column 130 to form a thin portion of the sample with trenches on opposing sides. The thin portion of the sample, referred to sometimes herein as a lamella, can then be exposed to an electron beam, generated by SEM column 120, at a non-vertical angle (e.g., in a tilted operational mode) as part of a material analysis step as described in more detail below. To enable SEM column 120 to be tilted, the column cap (not shown) can have a conical shape that enables the column to be positioned very close to sample 145 without the column cap interfering with the sample.

Challenges in X-Ray Analysis of a Cross-Section

Figure 2:
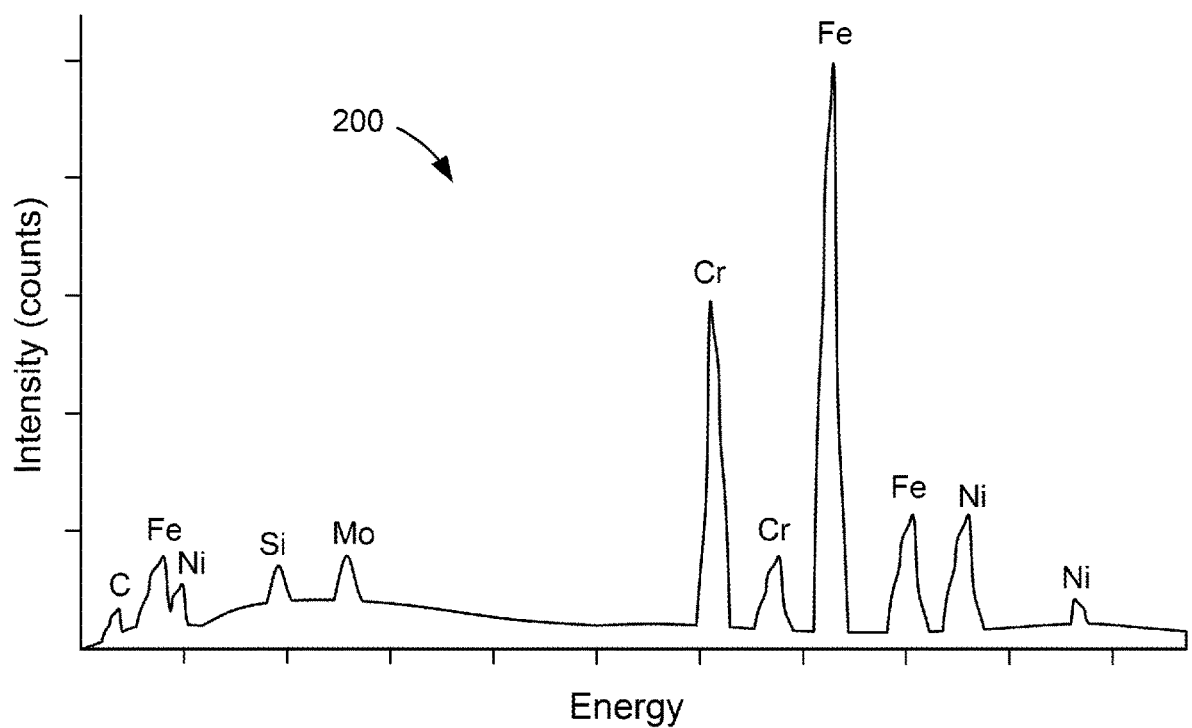
FIG. 2 is an example of an energy-dispersive x-ray spectroscopy graph of a sample material according to some embodiments.

FIG. 2 is an example of an energy-dispersive x-ray spectroscopy graph 200 of a sample material that can be generated based on x-ray emissions collected by system 100. When a solid target is bombarded by an electron beam, x-ray emissions can be detected by EDX detector 150 of system 100. Some of the detected x-rays are characteristic x-rays that represent x-ray beams emitted after an inner shell ionization of an atom in the sample material by the bombarded electron followed by an outer shell electron filling the now empty inner shell. Characteristic x-rays have specific energies characteristic to the sample material where the specific energy is equal to the energy difference between the two shells the electron "jumped" between. As an example, the various intensity peaks at different energy levels shown in graph 200 are indicative of different chemical elements within the sample being analyzed and demonstrate that the sample includes at least iron (Fe), chromium (Cr), carbon (C), Molybdenum (Mo), nickel (Ni) and silicon (Si).

Figure 3:
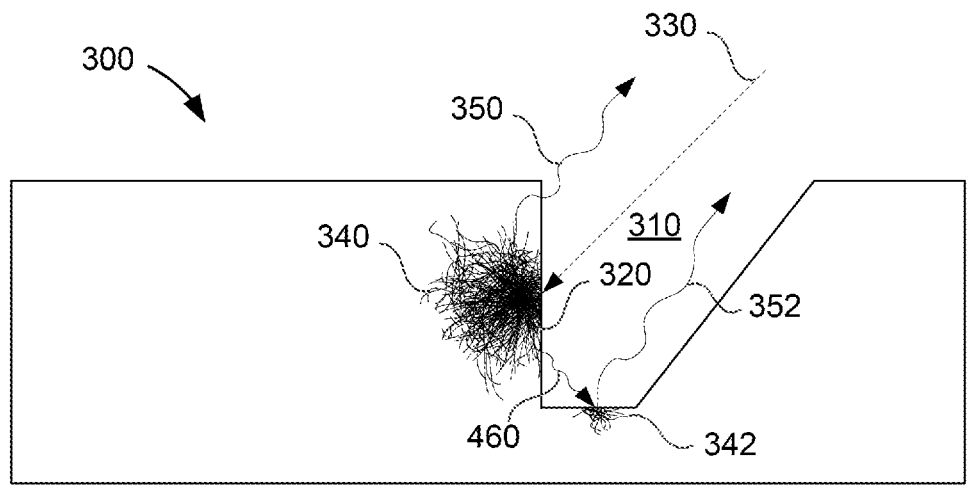
FIG. 3 is a simplified cross-sectional view of a sample that can be subject to a previously known x-ray material analysis process.

FIG. 3 is a simplified cross-sectional view of a sample 300 that can be processed to generate a graph similar to graph 200 depicted in FIG. 2. As shown in FIG. 3, a trench 310 has been milled in the sample exposing a cross-section of the sample including a surface 320. During a material analysis step, surface 320 can be exposed to a high energy electron beam 330 at a non-vertical angle that generates a relatively large interaction volume 340. X-rays 350 can be ejected from the sample from various spots within the interaction volume 340. The ejected x-rays can be detected by an evaluation tool, such as system 100, to determine the type of material the x-rays are ejected from. Because of the size of interaction volume 340, however, the resolution of the material analysis step is insufficient for some applications. That is, the evaluation system cannot determine where within the interaction volume the x-rays are ejected from and thus can only conclude that the material identified from the evaluation process is somewhere within the relatively large interaction volume.

Additionally, in some instances the collision between the electron beam 330 and the sample can generate backscattered electrons 360 that can collide with a surface of sample within trench 310 creating a second, smaller interaction volume 342 within the trench. X-rays 352 can be generated from within interaction volume 342 and detected by the evaluation system. In such instances, however, the detected x-ray signal represents both x-rays 350 and x-rays 352 mixed together. Thus, the evaluation system cannot determine whether any material identified by the x-ray signal is from the portion of sample 300 within interaction volume 340 or the portion of sample 300 within interaction volume 342.

Figure 4:
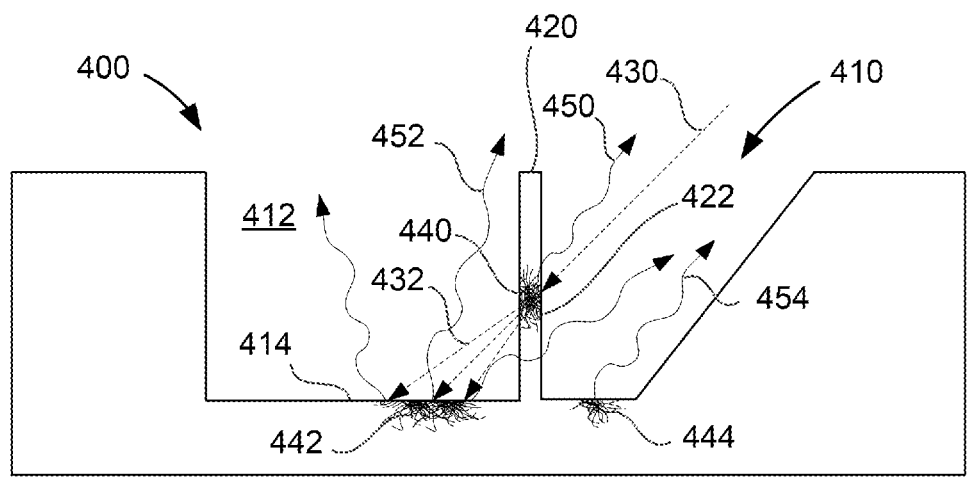
FIG. 4 is a simplified cross-sectional view of another sample that can be subject to an x-ray material analysis process.

FIG. 4, which is a simplified cross-sectional view of a sample 400 that can be subject to an x-ray material analysis process, depicts a technique that can reduce the interaction volume and provide improved material analysis results. As shown in FIG. 4, first and second trenches 410, 412 have been milled in the sample forming a thin portion 420 (referred to as lamella 420) between the two trenches. During a material analysis step, a surface 422 of lamella 420 can be exposed to a high energy electron beam 430 at a non-vertical angle. The electron beam generates an interaction volume 440 within lamella 420. X-rays 450 can be ejected from the sample from various spots within the interaction volume 440.

Because lamella 420 is relatively thin, even when electron beam 430 is generated at the same relatively high energy level as the electron beam 230 discussed above with respect to FIG. 2, interaction volume 440 is considerably smaller than interaction volume 340. The reduced interaction volume can enable improved x-ray material analysis results as compared to the process described with respect to FIG. 2. Because lamella 420 is relatively thin, however, some portion of electron beam 430 can penetrate fully through the lamella such that beam portions 432 impinge upon a bottom surface 414 of trench 412 generating a second interaction volume 442 beneath the surface 414. X-rays 452 can thus also be generated from the second interaction volume 442. Additionally, as discussed above with respect to FIG. 3, in some instances x-rays 454 can be generated by the collision of backscattered electrons (not shown in FIG. 4) with a surface of the sample within trench 410 generating a third interaction volume 444.

X-rays 450 and x-rays 452 (and, if present, x-rays 454) can be detected by an evaluation tool, such as system 100, to determine the type of material the x-rays are ejected from. The detected x-ray signal, however, represents all the generated x-rays 450 and x-rays 452 (and x-rays 454 if present) mixed together. Thus, the evaluation system cannot determine whether any material identified by the x-ray signal is from the portion of sample 400 within interaction volume 440 or the portion of sample 400 within interaction volume 442 (or, when x-rays 454 are part of the signal, the portion of the sample within interaction volume 444).

X-Ray Imaging a Cross-Section According to the Disclosure

Figure 5:
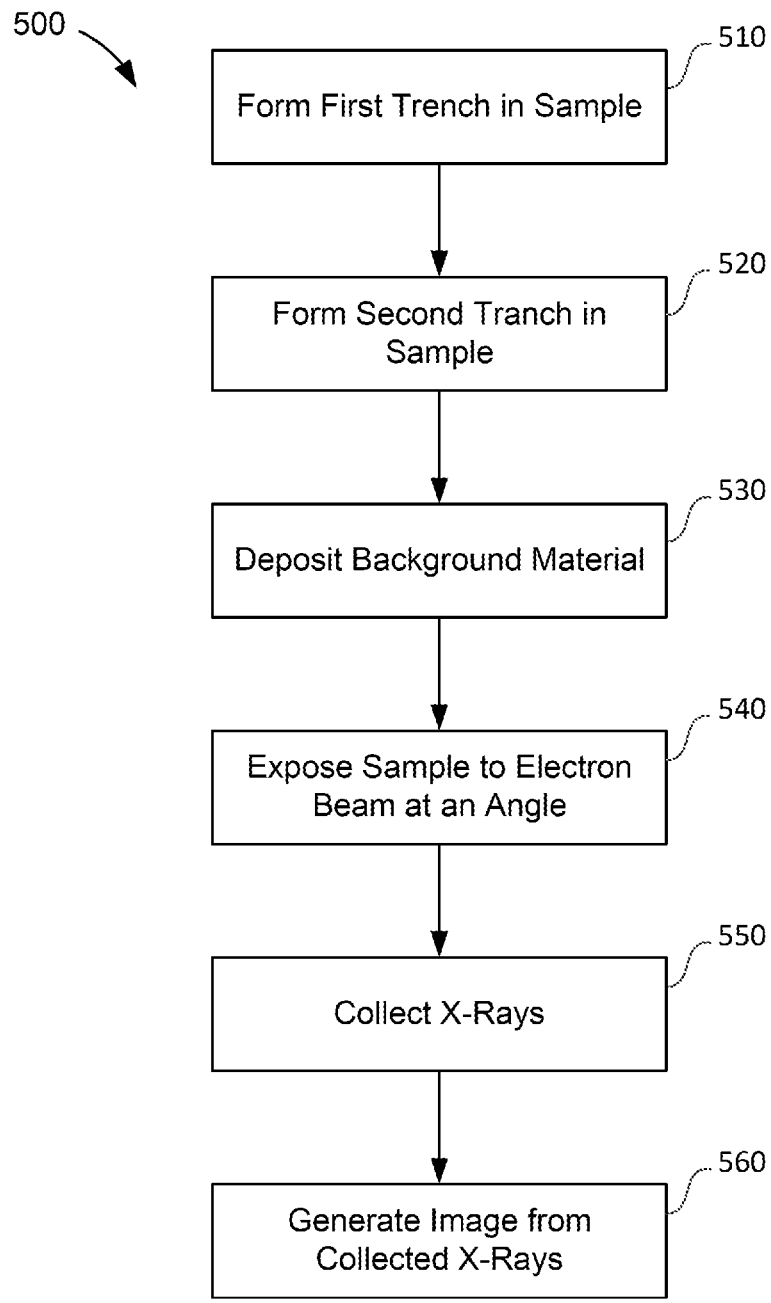
FIG. 5 is a simplified flowchart of steps associated with an x-ray imaging material analysis process according to some embodiments.
Figure 6A:
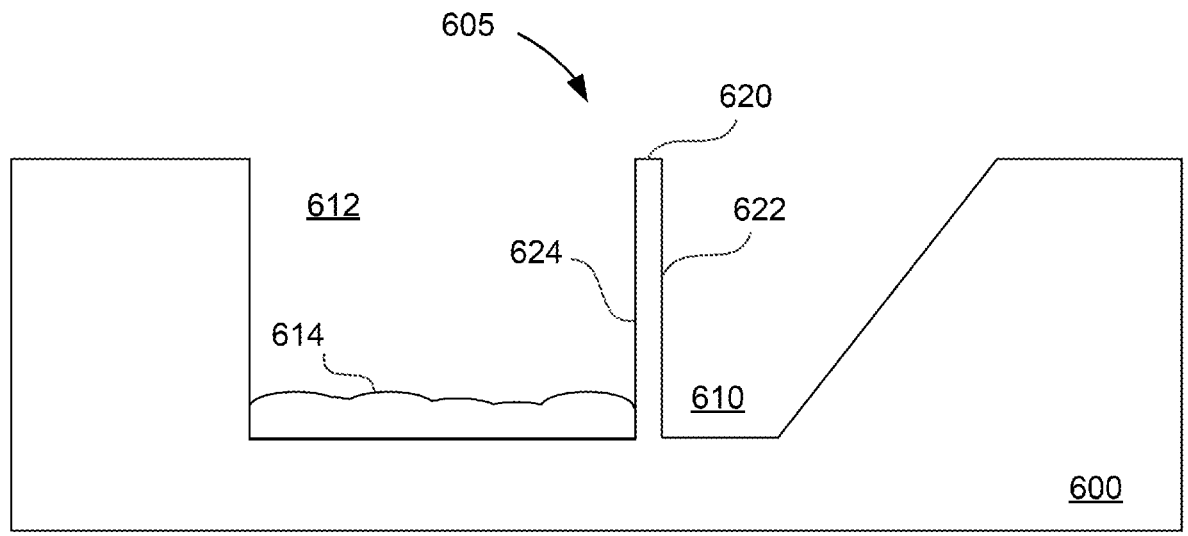
FIGS. 6A and 6B are simplified cross-sectional views of a sample that can be subject to an x-ray material analysis process according to embodiments of the disclosure.
Figure 6B:
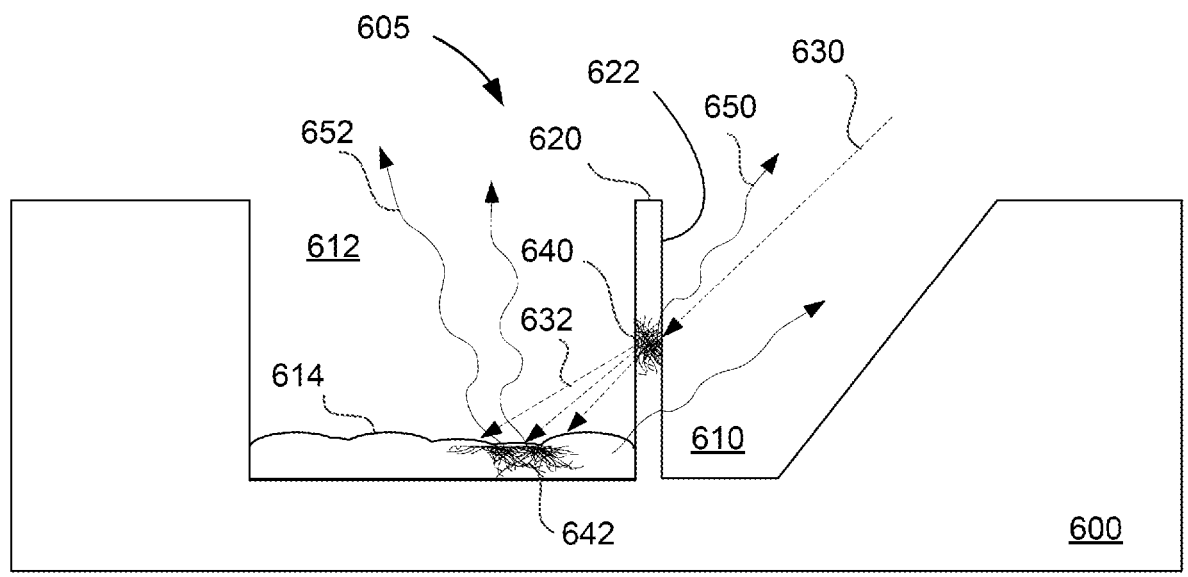

Embodiments of the disclosure provide an improved method of performing x-ray imaging in a cross-section within a region of interest of a sample when the materials within the region interest of the sample being cross-sectioned are previously known. To better illustrate embodiments, reference is made to FIGS. 6A, 6B along with FIG. 5 where FIG. 5 is a simplified flowchart of steps associated with a method 500 according to some embodiments of the disclosure, and FIGS. 6A and 6B are simplified cross-sectional views of a sample 600 at different stages of an x-ray material analysis process according to method 500. Method 500 is particularly useful for x-ray material analysis of a sample for which the materials within the sample are known, but can be used with any sample as long as a background material (discussed below) can be selected that is known to not be present within the portion of the sample being analyzed.

Referring first to FIG. 6A, method 500 includes forming a first trench 610 within sample 600 (FIG. 5, block 510). Trench 610 can be formed by milling sample 600 in a region 605 where a cross-section of the sample 600 is to be imaged.

The milling can be done by, for example, positioning the sample in evaluation tool 100 and moving the sample under the field-of-view of FIB column 130.

Next, a second trench 612 can be formed in region 605 in close proximity to first trench 610 (FIG. 5, block 520). Trench 612 can be formed by milling sample 600 with evaluation tool 100 in the same general manner as trench 610 is formed. Trench 612 can be spaced apart from trench 610 forming a thin region 620 in the region 605 where a cross-section of sample 600 is to be performed. Thin region 620, sometimes referred to herein as lamella 620, includes the region of interest (ROI) in which an x-ray material analysis of a cross-section of region 605 is to be performed. Lamella 620 can include first and second opposing surfaces 622, 624 facing the first and second trenches 610, 612, respectively.

Next, a layer of background material 614 is deposited within trench 612 (FIG. 5, block 530) prior to performing the x-ray imaging. Since the material that is within lamella 620 is known, the background material should be chosen so that it does not include any of the same chemical elements that are within the lamella. As an example, if it is known that the lamella includes alternating layers of silicon oxide and silicon nitride, the background material should be chosen such that it does not include any silicon, nitrogen or oxygen. As another example, if it is known that the lamella includes silicon oxide, polysilicon and tungsten, the background material should be chosen such that it does not include any silicon, oxygen or tungsten. For either example, the background material could be gold or copper. Additionally, the background material 614 should be deposited within trench 612 to a sufficient depth so as to prevent the electron beam portions 632 from reaching the surface of sample 600 underlying the background material 614. The precise depth will depend, among other factors, on the thickness of lamella 620, the materials within the lamella and the energy of electron beam 630 as can be determined experimentally or by simulation by a person of skill in the art. In some embodiments where the x-ray detector is positioned across from the tilted SEM column, the background material 614 can be deposited to a height that is below the area of interaction in the lamella (i.e., the area on the lamella in which the electron beam is directed during the x-ray imaging process). Otherwise, in such embodiments, the background material could interfere with x-rays generated from within the lamella forcing some of the x-ray emissions to travel through the background material before reaching the detector resulting in a poor x-ray signal quality.

Referring now to FIG. 6B, after the background material 614 is deposited within trench 612, an electron beam 630 can be scanned across a portion (e.g., a region of interest) of the lamella (FIG. 5, block 540). The electron beam can advantageously be scanned across lamella 620 with the SEM column in tilted mode such that electron beam 630 collides with lamella 620 at a non-vertical angle, which can be, for example, 45 degrees with respect to an upper surface of the sample (or expressed differently, 45 degrees with respect to the vertical sidewall surface of the lamella).

During the scanning process, electrons generated from the area of interaction 640 within the sample can be collected (block 550). Because lamella 620 is relatively thin and electron beam 630 can be a relatively high energy beam, portions 632 of the electron beam can pass entirely through the lamella 620 and collide with the deposited background material 614 in a second area of interaction 642. Thus, the x-rays collected during step 550 can include x-rays 650 generated from the lamella (area of interaction 640) along with and x-rays 652 generated from the background material (second area of interaction 642). Since the background material is known and is composed entirely of chemical elements that are not within the lamella, characteristic x-ray signals that are indicative of the background material can be ignored. The characteristic x-ray signals representing the known chemical elements that are within the lamella can then be used in a material analysis step to generate high resolution material analysis images of the area scanned (FIG. 5, block 560).

Figure 6C:
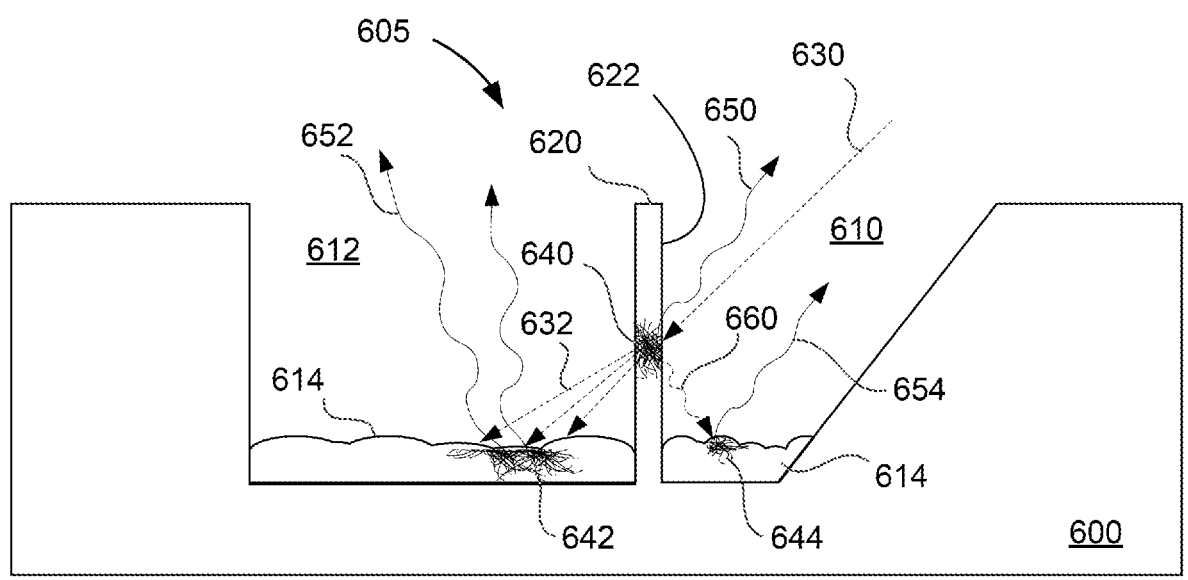
FIG. 6C is a simplified cross-sectional views of a sample that can be subject to an x-ray material analysis process according to some additional embodiments of the disclosure.

As described above with respect to FIGS. 3 and 4, in some instances backscattered electrons can generate an additional interaction volume within the trench 610 potentially generating additional x-rays that might otherwise become part of the detected x-ray signal. To address this possibility, some embodiments deposit background material 614 (e.g., in step 530) in both trench 610 and trench 612 as shown in FIG. 6C. Thus, backscattered electrons 660 that might otherwise collide with the surface within trench 610 can instead collide with background material 614 deposited within the trench 610 in a third area of interaction 644. In such embodiments, the x-rays collected during step 550 can include x-rays 650 generated from the lamella within area of interaction 640, x-rays 652 generated from the background material within the second area of interaction 642 and x-rays 654 generated from the background material within the third area of interaction 644. Since the background material is known and is composed entirely of chemical elements that are not within the lamella, characteristic x-ray signals that are indicative of the background material can be ignored as described above.

As described above, the embodiments of the disclosure enable high-resolution material analysis in a cross-section of a sample without bending or cutting the lamella as is required by certain other known techniques.

An Example of a Region of Interest

Figure 7:
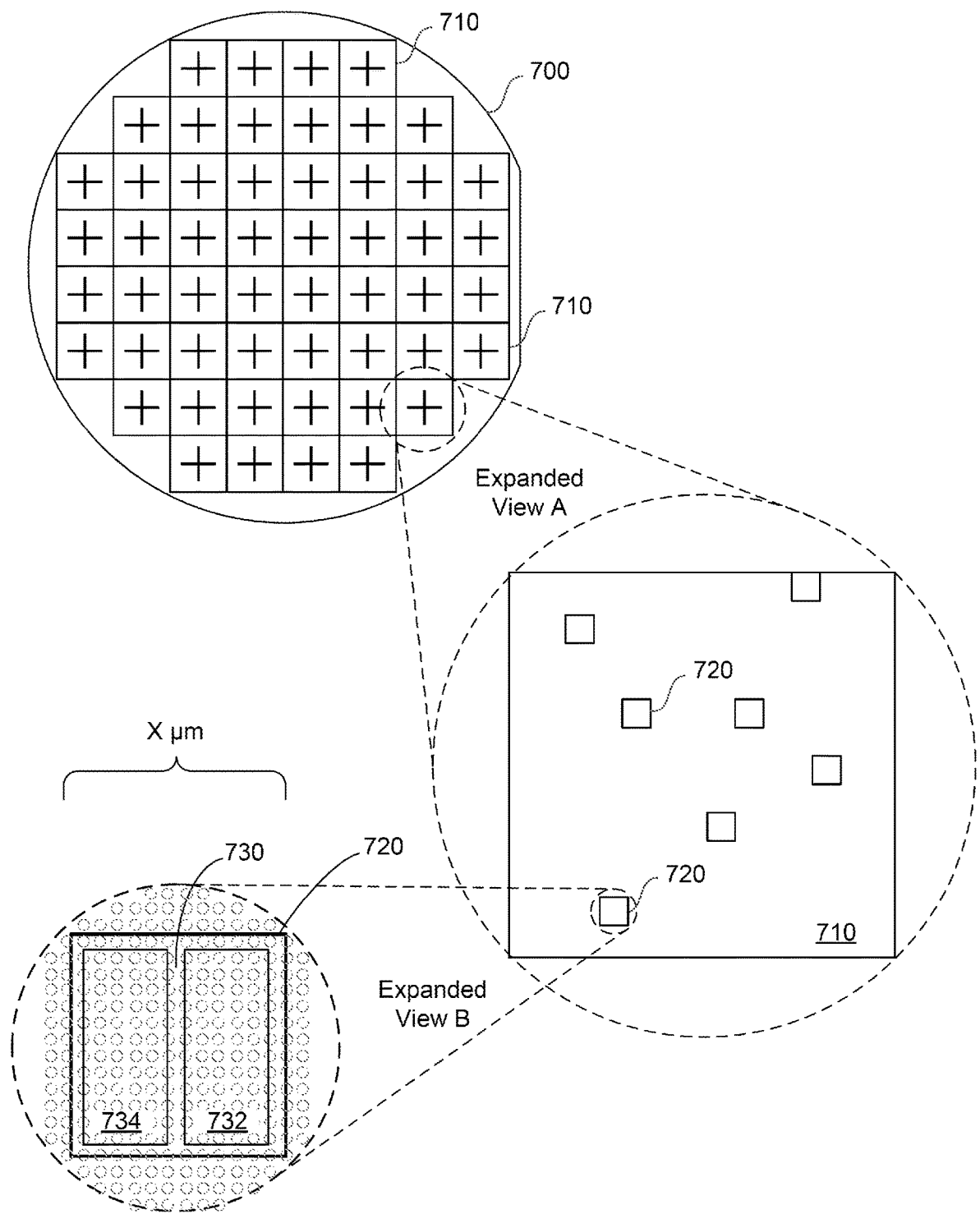
FIG. 7 is a simplified illustration of an area on a semiconductor wafer that can be analyzed according to some embodiments.

To further illustrate an exemplary region of interest (ROI) that can be analyzed in accordance with method 500, reference is made to FIG. 7, which is a simplified illustration of a semiconductor wafer 700. FIG. 7 includes a top view of wafer 700 along with two expanded views of specific portions of wafer 700. Wafer 700 can be, for example, a 200 mm or 300 mm semiconductor wafer and can include multiple integrated circuits 710 (fifty two in the example depicted) formed thereon. The integrated circuits 710 can be at an intermediate stage of fabrication and the x-ray analysis techniques described herein can be used to evaluate and analyze one or more regions of interest (ROI) 720 of the integrated circuits. For example, Expanded View A of FIG. 7 depicts multiple ROIs 720 of one of the integrated circuits 710 that can be evaluated and analyzed according to the techniques described herein. Expanded View B depicts one of those ROIs 720 that includes several different types of structures.

Within each ROI 720, the structures and different chemical elements within the ROI are known enabling the ROI to be analyzed using the cross-sectional x-ray imaging techniques described herein. Thus, some embodiments can analyze and evaluate each ROI 720 by forming a lamella 730 between first and second trenches 732, 734 (as shown in Expanded View B) and sequentially scanning a cross-sectional area of the lamella with an electron beam back and forth according to a raster pattern. During each scan, x-rays can be collected and analyzed to determine the chemical elements present at each location of the scan pattern.

The foregoing description, for purposes of explanation, used specific nomenclature to provide a thorough understanding of the described embodiments. However, it will be apparent to one skilled in the art that the specific details are not required in order to practice the described embodiments. For example, while the embodiments above discussed directing the electron beam at a 45 degree angle to the surface of the lamella, in other embodiments any non-vertical angle can be employed. For instance, in one particular SEM-FIB tool, the SEM column can be adjusted to lie in any angle between 45 and 90 degrees (in reference to the sample's upper surface) and thus non-vertical angles between 45 degrees and 90 degrees can be used. In other tools, where the SEM column can be adjusted to angles less than 45 degrees, non-vertical angles less than 45 degrees can be employed. Also, while the example above discusses forming the first trench prior to the second trench, the order in which the trenches are milled is not important and in some embodiments the second trench can be formed before the first trench. Also, FIGS. 6A and 6B depict trench 610 as having a vertical sidewall an angled sidewall opposite the vertical sidewall. The sidewalls spaced apart from and opposite the lamella in each of trenches 610 and 612 are not limited to the particulars shown in FIGS. 6A and 6B and can be substantially vertical, angled or have any other appropriate contour.

Thus, the foregoing descriptions of the specific embodiments described herein are presented for purposes of illustration and description. They are not intended to be exhaustive or to limit the embodiments to the precise forms disclosed. Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings.

To the extent the illustrated embodiments in the present patent application can, for the most part, be implemented using electronic components and circuits known to those skilled in the art, details of such are not explained in any greater extent than that considered necessary as illustrated above, for the understanding and appreciation of the underlying concepts of the present patent application and in order not to obfuscate or distract from the teachings of the present disclosure.

What is claimed is:

1. A method of performing x-ray spectroscopy material analysis of a region of interest within a cross-section of a sample using an evaluation system that includes a focused ion beam (FIB) column, a scanning electron microscope (SEM) column, and an x-ray detector, the method comprising:

forming a lamella having first and second opposing side surfaces in the sample by milling, with the FIB column, first and second trenches in the sample to expose the first and second sides surface of the lamella, respectively;

depositing background material in the second trench, wherein the background material is selected such that the background material does not include any chemical elements that are expected to be within the region of interest of the sample;

generating a charged particle beam with the SEM column and scanning the charged particle beam across a region of interest on the first side surface of the lamella such that the charged particle beam collides with the first side surface of the lamella at a non-vertical angle; and detecting x-rays generated while the region of interest is scanned by the charged particle beam.

2. The method of claim 1 further comprising generating a two-dimensional image of the scanned region of interest based on the detected x-rays.

3. The method of claim 1 wherein the first and second side surfaces of the lamella are substantially vertical and the charged particle beam is scanned across a region of interest on the substantially vertical first side surface of the lamella.

4. The method of claim 1 wherein the background material is deposited within the trench at a level below an area of interaction between the scanned charged particle beam and the lamella.

5. The method of claim 1 wherein the SEM column and FIB column are part of a SEM-FIB evaluation tool.

6. The method of claim 1 wherein the charged particle beam is directed to collide with the first surface of the lamella at a 45 degree angle to the first surface.

7. The method of claim 1 wherein the sample comprises a semiconductor wafer.

8. A system for evaluating a region of a sample, the system comprising:

a vacuum chamber;

a sample support configured to hold a sample within the vacuum chamber during a sample evaluation process;

a focused ion beam (FIB) column configured to direct a charged particle beam into the vacuum chamber toward the sample;

a scanning electron microscope (SEM) column configured to direct a charged particle beam into the vacuum chamber toward the sample;

a detector configured to detect x-rays generated from the collision between the charged particle beam and the sample; and a processor and a memory coupled to the processor, the memory including a plurality of computer-readable instructions that, when executed by the processor, cause the system to:

form a lamella having first and second opposing side surfaces in the sample by milling, with the FIB column, first and second trenches in the sample to expose the first and second sides surface of the lamella, respectively;

deposit background material in the second trench, wherein the background material is selected such that the background material does not include any chemical elements that are expected to be within the region of interest of the sample;

generate a charged particle beam with the SEM column and scan the charged particle beam across a region of interest on the first side surface of the lamella such that the charged particle beam collides with the first side surface of the lamella at a non-vertical angle; and detect x-rays generated while the region of interest is scanned by the charged particle beam.

9. The system according to claim 8 further comprising generating a two-dimensional image of the scanned region of interest based on the detected x-rays.

10. The system according to claim 8 wherein the first and second side surfaces of the lamella are substantially vertical and the charged particle beam is scanned across a region of interest on the substantially vertical first side surface of the lamella.

11. The system according to claim 8 wherein the background material is deposited within the trench at a level below an area of interaction between the scanned charged particle beam and the lamella.

12. The system according to claim 8 wherein the SEM column and FIB column are part of a SEM-FIB evaluation tool.

13. The system according to claim 8 wherein the charged particle beam is directed to collide with the first surface of the lamella at a 45 degree angle to the first surface.

14. The system according to claim 8 wherein the sample comprises a semiconductor wafer.

15. A non-transitory computer-readable memory that stores a plurality of computer-readable instructions for evaluating a region of a sample by:

forming a lamella having first and second opposing side surfaces in the sample by milling, with the FIB column, first and second trenches in the sample to expose the first and second sides surface of the lamella, respectively;

depositing background material in the second trench, wherein the background material is selected such that the background material does not include any chemical elements that are expected to be within the region of interest of the sample;

generating a charged particle beam with the SEM column and scanning the charged particle beam across a region of interest on the first side surface of the lamella such that the charged particle beam collides with the first side surface of the lamella at a non-vertical angle; and detecting x-rays generated while the region of interest is scanned by the charged particle beam.

16. The non-transitory computer-readable memory set forth in claim 15 wherein the computer-readable instructions for evaluating a region of a sample further comprise instructions for generating a two-dimensional image of the scanned region of interest based on the detected x-rays.

17. The non-transitory computer-readable memory set forth in claim 15 the first and second side surfaces of the lamella are substantially vertical and the charged particle beam is scanned across a region of interest on the substantially vertical first side surface of the lamella.

18. The non-transitory computer-readable memory set forth in claim 15 the background material is deposited within the trench at a level below an area of interaction between the scanned charged particle beam and the lamella.

19. The method of claim 1 further comprising depositing the background material in the first trench prior to scanning the charged particle beam across the region of interest.

20. The non-transitory computer-readable memory set forth in claim 15 the charged particle beam is directed to collide with the first surface of the lamella at a 45 degree angle to the first surface.

\* \* \* \* \*